United States Patent [19]

Sieck et al.

[11] Patent Number: 5,487,821
[45] Date of Patent: Jan. 30, 1996

[54] ANODE STRUCTURE FOR MAGNETRON SPUTTERING SYSTEMS

[75] Inventors: Peter A. Sieck, Santa Rosa; Russell J. Hill, El Cerrito, both of Calif.; John L. Vossen, Bridgewater, N.J.; Stephen C. Schulz, Benicia, Calif.

[73] Assignee: The BOC Group, Inc., Murray Hill, N.J.

[21] Appl. No.: 425,671

[22] Filed: Apr. 18, 1995

Related U.S. Application Data

[63] Continuation of Ser. No. 86,136, Jul. 1, 1993, abandoned.

[51] Int. Cl.$^6$ ................................................. C23C 14/34
[52] U.S. Cl. ............................... 204/192.12; 204/298.14; 204/298.19; 204/298.21
[58] Field of Search .................... 204/192.12, 298.14, 204/298.21, 298.22, 298.19, 298.28

[56] References Cited

U.S. PATENT DOCUMENTS

| | | | |
|---|---|---|---|
| 3,514,391 | 5/1970 | Hablanian et al. | 204/298.14 X |
| 3,594,301 | 7/1971 | Bruch | 204/298.14 X |
| 3,616,449 | 10/1971 | Pellegrin | 204/298.14 |
| 3,767,559 | 10/1973 | Agnone et al. | 204/298.14 |
| 4,046,659 | 9/1977 | Cormia et al. | 204/192 C |
| 4,166,018 | 8/1979 | Chapin | 204/192 R |
| 4,478,702 | 10/1984 | Gillery et al. | 204/298 |
| 4,619,755 | 10/1986 | Hessberger et al. | 204/298.14 |
| 4,849,087 | 7/1989 | Meyer | 204/298 |
| 4,888,199 | 12/1989 | Felts et al. | 427/10 |
| 5,047,131 | 9/1991 | Wolfe et al. | 204/192.23 |
| 5,106,474 | 4/1992 | Dickey et al. | 204/298.14 |
| 5,171,411 | 12/1992 | Hillendahl et al. | 204/192.12 |

FOREIGN PATENT DOCUMENTS

| | | | |
|---|---|---|---|
| 222900 | 5/1985 | Germany | 204/298.14 |
| 1808024A3 | 4/1993 | U.S.S.R. | |
| WO89/07664 | 8/1989 | WIPO | |

OTHER PUBLICATIONS

Metals Handbook, 8th Ed., vol. 2, "Heat Treating, Cleaning and Finishing", American Society for Metals, Metals Park, Ohio, 1964, pp. 405–408.

WPI/Derwent Publications Ltd., Kolosov, V. V. et al., SU 180 8024 A3, Apr. 7, 1993; Abstract.

Chapin, "The Planar Magnetron," *Research/Development Vacuum Technology*, Jan. 1974, pp. 37–40 (p. 38 is not part of article and is not included).

*Primary Examiner*—Nam Nguyen
*Attorney, Agent, or Firm*—David A. Draegert; Salvatore P. Pace

[57] ABSTRACT

An elongated anode structure having multiple points to which electrons are attracted is provided. The anode can be constructed of multiple wire brushes that are attached to a metal rod. Use of the anode in magnetron systems significantly reduces dielectric material build-up and improves film uniformity in both dc reactive and non-reactive sputtering. Moreover, the anode reduces overheating and increases the operation time of magnetron systems undergoing reactive sputtering of dielectric materials. In one embodiment, the magnetron system has a cylindrical cathode and a pair of elongated anodes positioned parallel to and equidistance from the cathode. The anode structure is particularly suited for sputtering uniform films of dielectric materials, including silicon dioxide and silicon nitride.

17 Claims, 4 Drawing Sheets

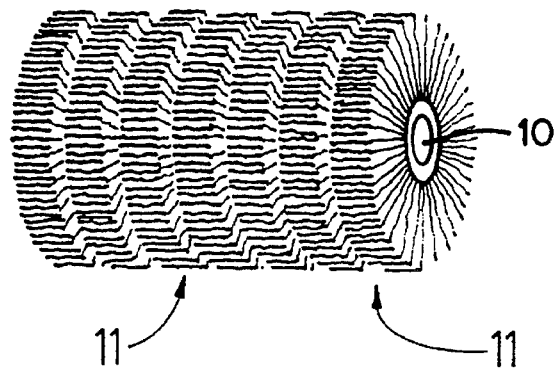
FIG._1.
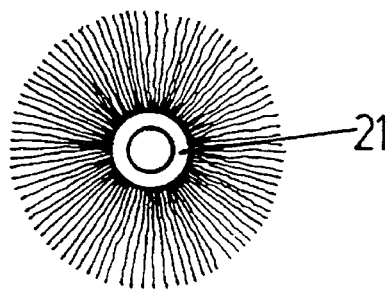
FIG._2.
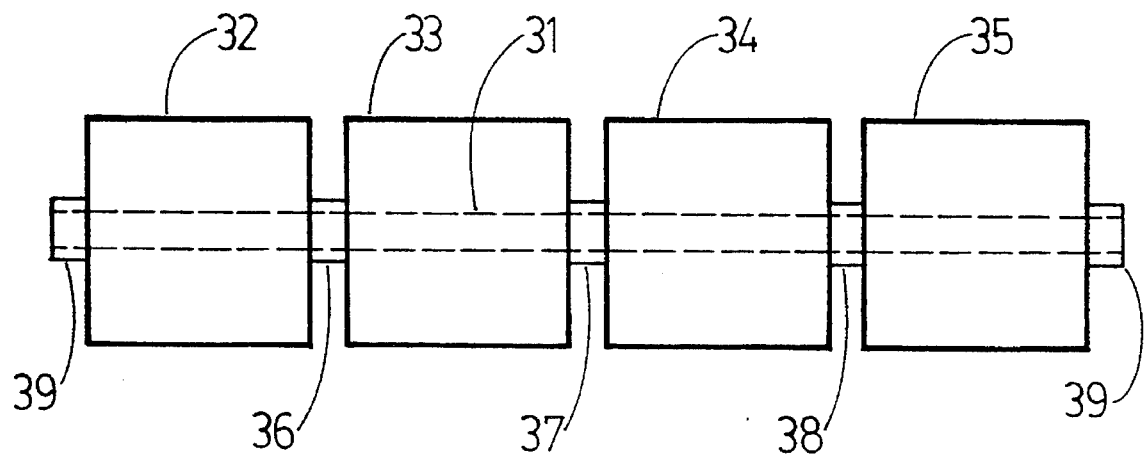
FIG._3.

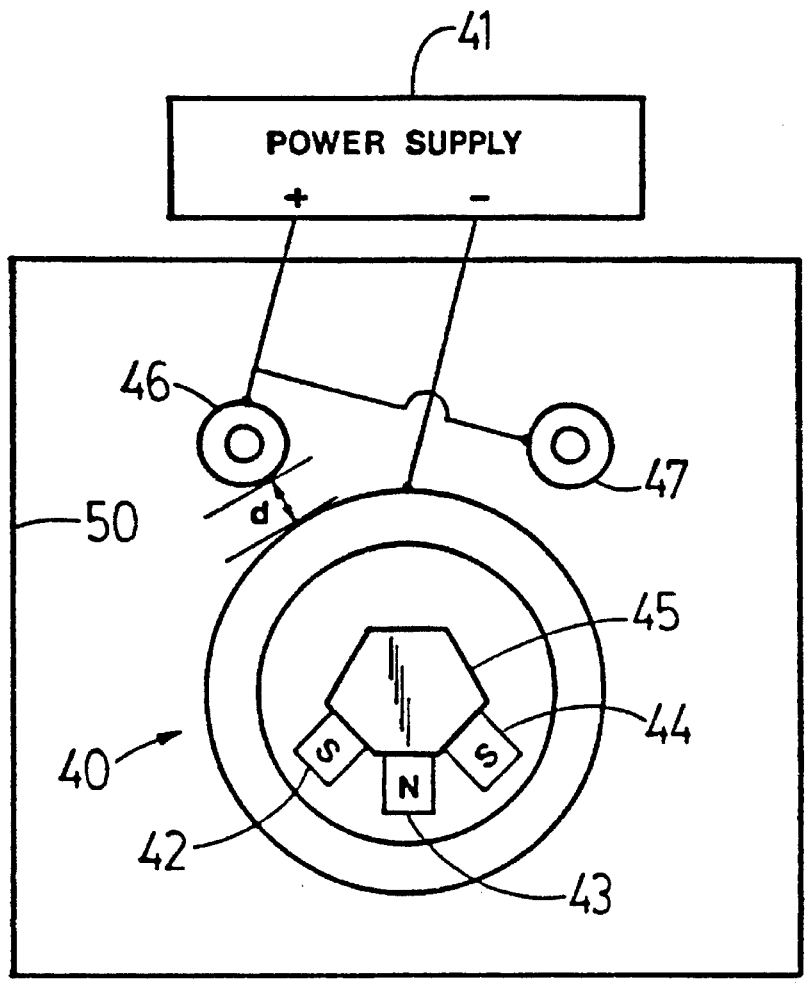
FIG._4.
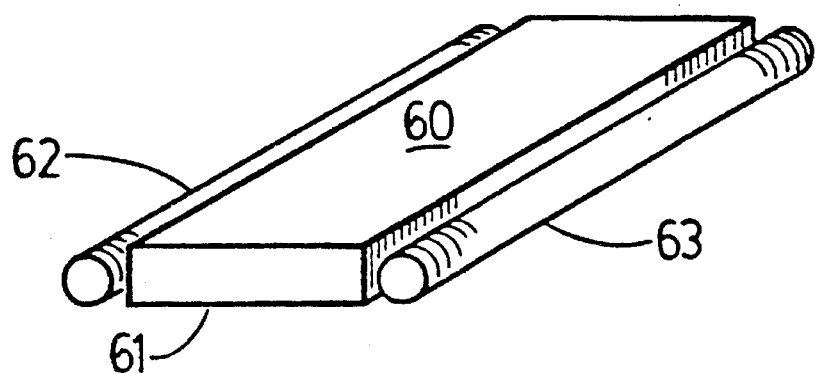
FIG._5.

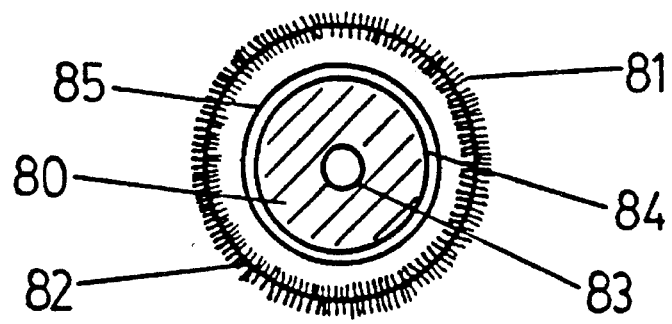
FIG._6.
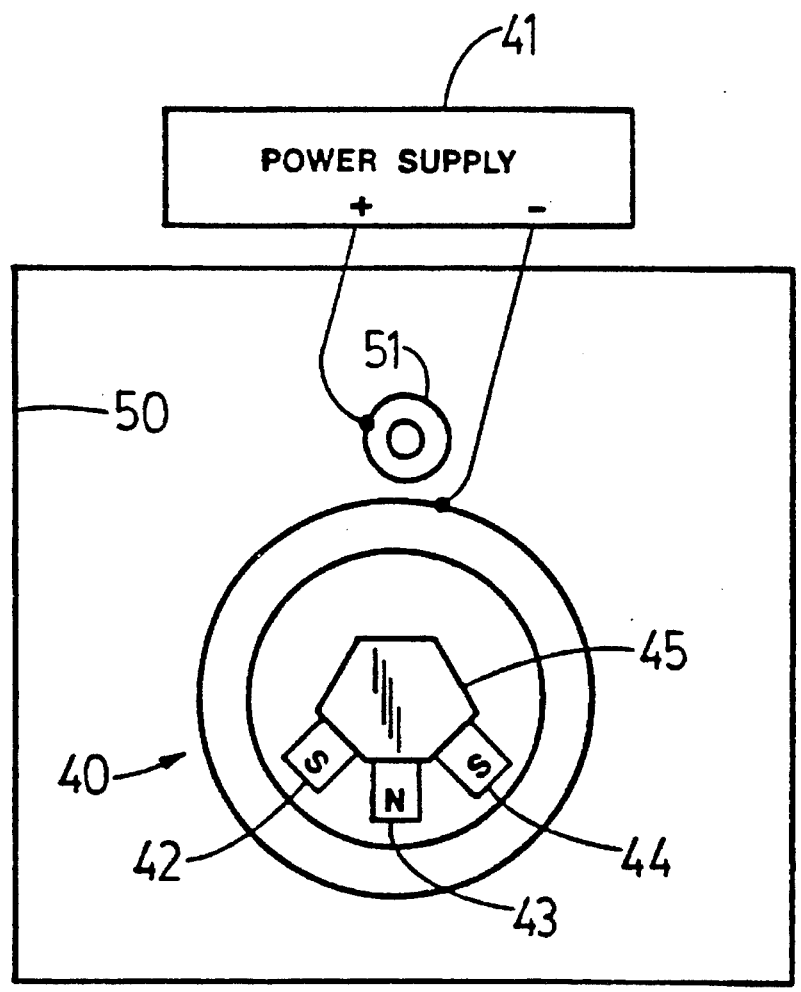
FIG._7.

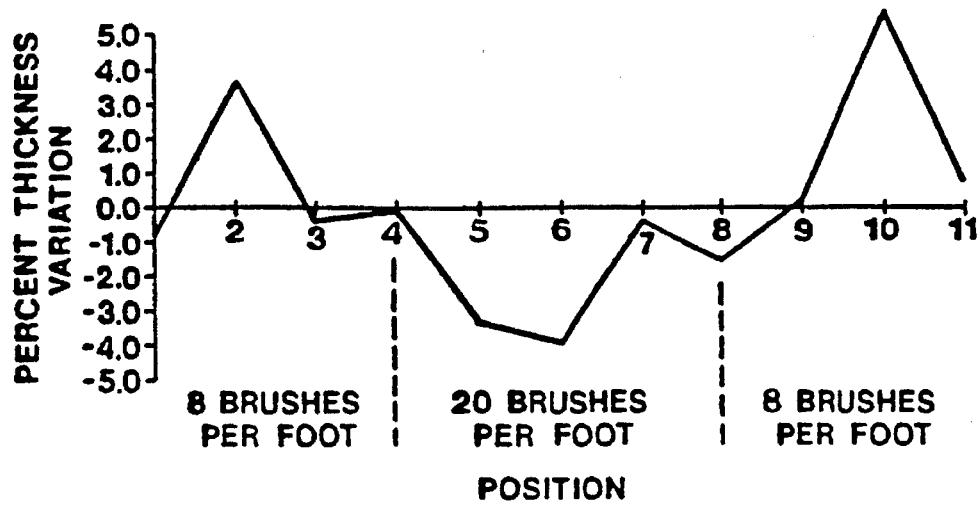
FIG._8.
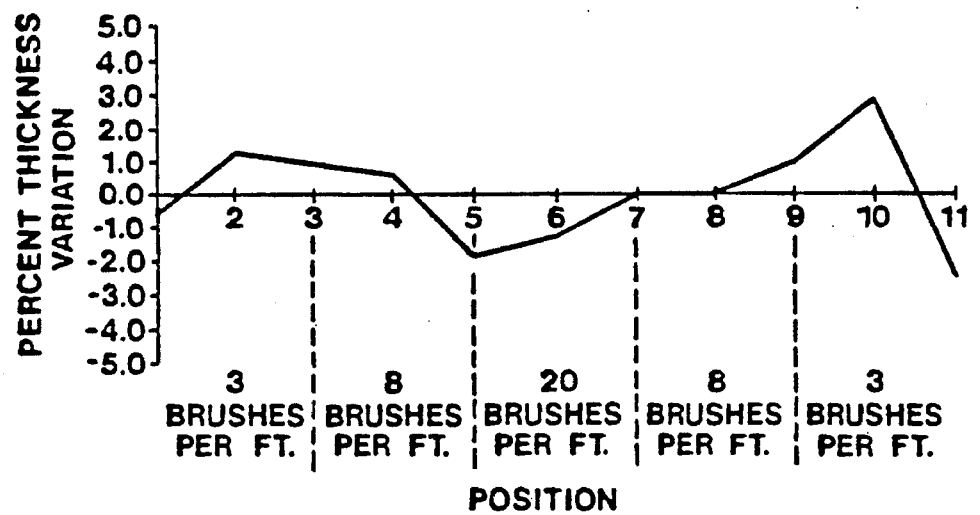
FIG._9.
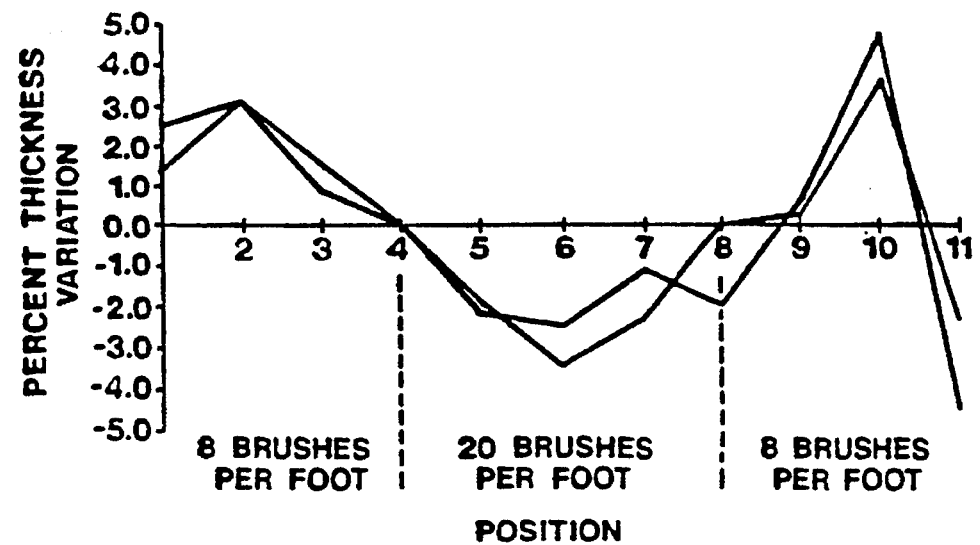
FIG._10.

5,487,821

ANODE STRUCTURE FOR MAGNETRON SPUTTERING SYSTEMS

This is a continuation of Application Ser. No. 08/086,136, filed Jul. 1, 1993, abandoned.

FIELD OF THE INVENTION

The invention relates generally to an apparatus and method for depositing films on a substrate, and more particularly to a reactive magnetron sputtering device and technique for depositing dielectric materials onto substrates in which the dielectric films have uniform thickness and in which the apparatus can operate continuously for long periods.

BACKGROUND OF THE INVENTION

Sputtering is the physical ejection of material from a target as a result of ion bombardment of the target. The ions are usually created by collisions between gas atoms and electrons in a glow discharge. The ions are accelerated into the target cathode by an electric field. A substrate is placed in a suitable location so that it intercepts a portion of the ejected atoms. Thus, a coating of target material is deposited on the surface of the substrate.

In an endeavor to attain increased deposition rates, magnetically enhanced targets have been used. In a planar magnetron, the cathode includes an array of permanent magnets arranged in a closed loop and mounted in a fixed position in relation to the flat target plate. Thus, the magnetic field is caused to travel in a closed loop, commonly referred to as a "race track", which establishes the path or region along which sputtering or erosion of the target material takes place. In a magnetron cathode, a magnetic field confines the glow discharge plasma and increases the path length of the electrons moving under the influence of the electric field. This results in an increase in the gas atom-electron collision probability. This leads to a much higher sputtering rate than that obtained without the use of magnetic confinement. Further, the sputtering process can be accomplished at a much lower gas pressure.

In dc reactive sputtering, a reactant gas forms a compound with the material which is sputtered from the target plate. When the target plate is silicon, and the reactive gas is oxygen, silicon dioxide is formed on the surface of the substrate. However, because silicon dioxide is such a good insulator, a film thick enough to cause arcing is rapidly formed in areas of the target plate outside of the race track. Silicon dioxide is known to be one of the most difficult dielectric films to deposit by magnetron reactive sputtering because of this characteristic. The arcing associated with silicon dioxide has prevented planar magnetron reactive sputtering from being efficiently utilized to deposit quality silicon dioxide films.

Another technique for coating silicon based compounds onto substrates involves reactive sputtering with a cylindrical magnetron having a silicon target. See Wolfe et al., U.S. Pat. No. 5,047,131, issued Sep. 10, 1991. In operation, due to the accumulation of dielectric material in various parts of the coating chamber, it is necessary to clean the system on a regular basis. Indeed, when coating silicon dioxide or silicon nitride by reactive sputtering, the system can operate continuously only for approximately 30 hours.

Finally, another limitation to the utility of both planar and cylindrical magnetrons (in either reactive or non-reactive sputtering) is that films deposited by sputtering have not achieved the degree of uniformity required for many high precision applications. This is true even during the initial 30 hours of sputtering. Recent attempts to improve film uniformity have been unsuccessful. See Dickey et al., U.S. Pat. No. 5,106,474, issued Apr. 21, 1992; Meyer, U.S. Pat. No. 4,849,087, issued Jul. 18, 1989; and Gillery et al., U.S. Pat. No. 4,478,702, issued Oct. 23, 1984.

SUMMARY OF THE INVENTION

It is the object of the present invention to provide an apparatus for reactive and non-reactive sputtering of uniform films.

It is another object to provide an electrode that is significantly less susceptible to dielectric material build-up as compared to conventional electrodes.

It is yet another object to provide a dc magnetron apparatus capable of reactively sputtering uniform films of dielectric material onto a substrate wherein said apparatus can operate continuously for long periods of time.

These and other objects are accomplished with the inventive electrode that has a multiplicity of points emanating from the body of the electrode. The electrode can be used in plasma applications in place of conventional electrodes, and particularly, as-an anode in dc reactive sputtering of dielectric materials in magnetrons. One aspect of the invention is that anode structures having multiple points do not become heavily coated with dielectric material. The result is that arcing is effectively eliminated and the magnetron can be operated continuously over long periods of time.

A preferred embodiment of the invention comprises a magnetron sputtering apparatus having a cylindrical cathode and a pair of elongated anodes that are positioned parallel to and equidistance from the cathode. Each anode defines a plurality of points along its length. In another embodiment, the magnetron sputtering apparatus includes a planar cathode and a pair of elongated anodes that are disposed on opposite sides of the cathode wherein the lower surfaces of the anodes and the planar target are coplanar.

Reactive sputtering of dielectric material from either device produces an insulating coating that has uniform thickness; moreover, the devices can operate for 300 hours or more even when reactively sputtering dielectric materials such as silicon dioxide or silicon nitride. A feature of the invention is that by modifying the point density along the length of the anodes, the uniformity of the sputtered film can be controlled. Another feature is that because the plurality of points distribute and dissipate heat more quickly than conventional anodes, the inventive anode also prevents overheating.

BRIEF DESCRIPTION OF THE DRAWINGS

FIG. 1 is a perspective view of an anode having a multiplicity of points.

FIG. 2 shows is a cross-sectional view of the wire wheel used in the anode of FIG. 1.

FIG. 3 is a schematic of the inventive anode.

FIG. 4 is a cross-sectional schematic view of a cylindrical cathode with a pair of anodes.

FIG. 5 is a perspective view of a planar cathode with dual anodes.

FIG. 6 is a plan view of a magnetron device having a circular planar target with an anode positioned off the target perimeter.

FIG. 7 is a cross-sectional schematic view of a cylindrical cathode with a single anode.

FIGS. 8, 9, and 10 are graphs of film percent thickness variation versus substrate position.

DETAILED DESCRIPTION OF THE PREFERRED EMBODIMENTS

The present invention is based in part on the discovery that a magnetron sputtering device, that utilizes one or more anodes each having a multiplicity of points emanating from the anode body, can reactively sputter dielectric materials continuously for long periods of time as compared to conventional magnetron systems. The inventive anode has a structure that is less susceptible to dielectric material build-up during reactive sputtering. In addition, it has been found that use of the inventive anode significantly improves the uniformity of the film produced in both reactive and non-reactive sputtering.

FIG. 1 is a perspective view of an embodiment of the inventive anode which comprises an elongated, central threaded steel rod (10) and a plurality of wire wheels 11 (also referred to as wire brushes) that are strung along the rod. Each wire wheel, as represented in the cross-sectional view of FIG. 2, has an outer diameter of approximately 3 inches (7.62 cm) and a center copper ring 21 from which approximately 2,000 steel wires are attached. The copper ring has a hole in the middle through which a rod can be inserted. (As is apparent, the wire wheel shown in FIG. 2 is illustrative only as not all 2,000 wires are depicted.) The length of each wire is not critical. Commercially available wire wheels can be used. One such wire wheel is manufactured by Osborn, Inc., Cleveland, Ohio, under the part No. 2698. Each steel wire has a diameter of 0.014 inches (0.35 mm) and the tip of each wire defines a point to which electrons are especially attracted during sputtering. Each wire should be thick enough so that it is not destroyed by high current flow during sputtering. The wire wheel has a width of 0.5 inches (1.27 cm) so that for an 82 inch (208.28 cm) long anode approximately 100 wire wheels are used and held together by nuts positioned between every 2 to 4 wire wheels. This provides approximately 30 square inches (194 cm$^2$) of wire tips per anode rod. A critical feature of the inventive anode is the large number of points present in the anode structure relative to the overall mass of the anode.

FIG. 3 is a schematic of the anode which includes the central threaded steel rod 31 that supports four sets of wire wheels 32, 33, 34, and 35. The rod functions as an electrically conductive body having a plurality of points emanating therefrom. Each set of wire wheel represents a plurality of individual wire wheels that are strung tightly together for good electrical contact. The diameter of the hole in each wire wheel should also be approximately equal to the outer diameter of the steel rod to maintain good electrical conductivity. Besides the end nuts 39, middle nuts 36, 37, and 38 are threaded into and disposed along the rod to separate the adjacent sets of wire wheels and to provide additional support for the wire wheels. The middle nuts thus define gaps along the rod of the anode that do not have wire points. Alternatively, each middle nut (36, 37, or 38) may represent a set of nuts with each nut in the set in electrical contact with the next one.

To deposit films of uniform thickness, it is preferred that the number of individual wire wheels in each set (32, 33, 34, and 35) be substantially the same so that the wire or point density is distributed evenly along the length of the anode. Furthermore, it is preferred that the wire wheels and nuts be distributed symmetrically so that the point density along the rod is relatively uniform. As will be discussed further below, when employing multiple anodes, each anode can be configured differently by arranging the wire wheels and nuts in various combinations, although for most applications it is preferred to employ elongated anodes that have the same length and point density. The inventive anode can be constructed of any suitable electrically conductive material such as steel, copper, and nichrome. The superior performance of the inventive anode for reactively sputtering insulators makes it a good anode for non-reactive sputtering applications as well.

Generally in magnetron systems, the anode produces an accelerating electric field adjacent to the cathode target surface for creating a glow discharge that is confined by the magnetic field to a region near the sputtering surface. It has been found that when the inventive anode is employed in a dc magnetron sputtering device, the point density along the length of the anode can affect deposition. Specifically, a magnetron with an elongated anode with a high point density tends to have higher deposition rates. Moreover, if the point density along the elongated anode varies, material will sputter onto corresponding regions of the coating zone at different rates. In addition, it is believed that the plurality of points of the anode may affect how the plasma is distributed in the coating zone. Finally, it is believed that the strong electric field near each point causes electrons to project toward the anode with enough force to cause break down of significant amounts of dielectric material to prevent their accumulation (or significantly reduce the rate of accumulation) on the anode surface. The points of the anode also facilitate heat distribution and dissipation during sputtering.

Besides sputtering processes, the inventive anode can replace conventional anodes in plasma-enhanced chemical vapor deposition (PECVD), plasma polymerization and other vacuum thin film deposition processes. See, Felts et al., U.S. Pat. No. 4,888,199, issued Dec. 19, 1989, which is incorporated herein. Plasma properties may be enhanced and more readily regulated with the inventive anode since it is expected that the plurality of points will produce improved electric field characteristics for deposition. Furthermore, even for chemical applications that do not deposit material, plasma distribution may be improved with the inventive anode structure. As is apparent, an electrode having a plurality of points may also be used as a cathode in applications where a uniform electrode should be negatively charged.

FIG. 4 is a cross-sectional schematic view of a sputtering magnetron device comprising rotatable cylindrical cathode target 40 and anodes 46 and 47 that are positioned within evacuable chamber 50. The cylindrical magnetron has magnetic assembly 45 that comprises an array of magnetic poles arranged in straight parallel rows along the length of the cylindrical magnetron. Each row has three alternating magnetic poles 42, 43, and 44, wherein these poles are arranged to have respective north, south, north polarities. The design of rotatable cylindrical magnetrons is generally known. See Wolfe et al., U.S. Pat. No. 5,047,131, issued Sep. 10, 1991; McKelvey, U.S. Pat. No. 4,466,877, issued Aug. 31, 1984; and McKelvey, U.S. Pat. No. 4,356,073, issued Oct. 26, 1982, which are incorporated herein. Each anode has an elongated structure having a plurality of points emanating from the body structure as shown in FIGS. 1, 2, and 3. It is preferred that the length of each anode be about the same as that of the cathode. The anodes and cathode are connected to power source 41. Alternatively, either or both anodes can be grounded or connected to a separate power supply to apply a bias potential thereto. During sputtering, the anodes can be rotated periodically so that different points are directed toward the cathode.

Elongated inventive anode structures 46 and 47 are preferable positioned equidistance above the cathode and on opposite sides thereof. (Opposite sides of this cathode refers to the left and right sides that are formed by an imaginary plane that is parallel to the length of pole 43 and that bisects the cathode diameter.) For a cylindrical cathode having an outer diameter of approximately 6 inches (15.23 cm), the distance (d) between each anode structure and the cathode should be approximately 0.5 to 1.0 inches (1.27 to 2.54 cm) and the distance between the anodes should be approximately 4 to 5 inches (10.16 to 12.7 cm). Although the length of the cylindrical cathode is not critical, its length generally ranges from 20 to 130 inches (50.8 to 330.2 cm).

In operation, a potential sufficient to cause sputtering is supplied to the cylindrical cathode from a dc power source through a power line having sliding contact with each cathode by a conventional electrical brush. For silicon targets, the silicon is coated onto a backing tube. For material with sufficient strength, so-called "self-supporting" cylindrical targets can be employed. See Hillendahl et al., U.S. Pat. No. 5,171,411, issued Dec. 15, 1992, which is incorporated herein. To reactively sputter a film of silicon dioxide, inert (Ar) and reactive ($O_2$) gases are distributed into the evacuable chamber by conventional means. See Wolfe et al., U.S. Pat. No. 5,047,131, issued Sep. 10, 1991. To reactively sputter silicon nitride ($Si_3N_4$), nitrogen is used instead of oxygen.

The inventive anode can also be used with planar magnetrons for sputtering uniform metallic films or for reactively sputtering dielectric films. The design of magnetron devices with planar cathodes is generally known. See Chapin, U.S. Pat. No. 4,166,018, issued Aug. 28, 1979; and Cormia et al., U.S. Pat. No. 4,046,659, issued Sep. 6, 1977, all of which are incorporated herein. The cathode has a substantially planar target surface and has magnetic means for producing a magnetic field having lines of flux which extend in a curve from said planar surface and return thereto to form an endless arch over a closed loop erosion region on said planar surface. As with cylindrical magnetrons, the anodes in planar magnetrons serve essentially the same function which is to produce an accelerating electric field adjacent to the sputtering surface for producing a glow discharge plasma which is confined by the magnetic field. Hitherto, anodes have consisted of relatively smooth metal surfaces that are positioned along the perimeters of the planar target.

FIG. 5 is a perspective schematic view of a planar magnetron comprising planar cathode 60, that has a lower target surface 61, and inventive anode structures 62 and 63. Each anode is an elongated structure having a plurality of points emanating from its body as described previously and shown in FIGS. 1, 2, and 3. The anode structures are positioned on opposite sides of the cathode. The spacing or distance from the cathode to each anode is uniform along the length of the cathode and the length of each anode is preferably the same as that of the cathode. Although not critical, the lower surface of each anode is preferably coplanar with the lower target surface. For planar magnetrons with a rectangular target, preferably at least two anodes are mounted on opposite sides of the cathode. See Gillery et al., U.S. Pat. No. 4,478,702, which is incorporated herein.

FIG. 6 illustrates another embodiment of the invention which comprises a magnetron having a cathode with a circular planar target. As shown in this plan view, positioned along the entire perimeter of circular target 85 is a circular anode structure having a circular metallic rod 82 and a multiplicity of wires emanating therefrom. The tip (e.g. 81) of each wire defines a point. When the magnetron is energized, the glow discharge is confined to a region just above the target surface. As sputtering progresses, a circular erosion region 80 develops in the target. The erosion region has inner and outer edges 83 and 84, respectively.

Finally, FIG. 7 is a cross-sectional schematic view of a sputtering device similar to the device of FIG. 4 except that only a single elongated anode 51 is employed. (The other structural elements of the device of FIG. 7 are the same as those in FIG. 4 and bear the same reference numbers.) As is apparent, the single anode is positioned directly above the cylindrical target.

Uniform Films are Deposited by Sputtering with Inventive Anode.

A magnetron sputtering apparatus with dual rotatable cylindrical cathodes and dual anodes was employed to reactively sputter silicon nitride or silicon dioxide onto a substrate in experiments in which the point density along each anode was varied. The magnetron sputtering apparatus comprised of two single cathode and anode devices, each as shown in FIG. 7, that were positioned side-by-side in a vacuum chamber. Each cathode was approximately 84 inches (213.36 cm) long and approximately 5.6 inches (14.2 cm) in diameter. In the first experiment, the wire wheels and nuts for each anode were strung on the threaded rod so that the wire point density was highest in the middle of the elongated anode structure. Specifically, for the center region of the anode which covers approximately 40% of the rod structure, there were 20 wire wheels per foot (30.48 cm) of rod, whereas in the outer (or end) regions (each comprising about 30% of the rod), there were only 8 wire wheels per foot of rod.

Silicon nitride was reactively sputtered onto glass substrates with a dc magnetron apparatus employing anodes so configured. Eleven individual glass substrates were placed at eleven, evenly spaced apart, positions directly underneath and along the length of the cylindrical cathodes from one end to the other. FIG. 8 is a graph depicting the deviation of silicon nitride film thickness from the average based on thickness measurements of the eleven substrates. The thicknesses of the films ranged from approximately 700 to 800 Å. The films were sputtered in the apparatus which had completed over 30 hours of reactively sputtering $Si_3N_4$. As is apparent, the film deposited under the center region shows better uniformity than the films deposited under the end regions. Nevertheless, it has been demonstrated that the overall uniformity of the entire film, as shown in FIG. 8, is better than that of a silicon nitride film (of comparable thickness) sputtered with a cylindrical magnetron using conventional anodes.

In a second experiment, each anode of the apparatus was divided into five regions of different point densities: a center region, two intermediate regions, and two end regions. Each region occupied approximately 20% of the length of the anode and there were 20, 8, and 3 wire wheels per foot (30.48 cm) of rod for the center, intermediate, and end regions, respectively. Silicon nitride was reactively sputtered onto eleven substrates strategically positioned underneath the cylindrical cathodes as described previously. Similarly, for the second experiment, FIG. 9 is a graph depicting the thickness deviation of silicon nitride film reactively sputtered onto the substrates. The thicknesses of the films ranged from 700 to 800 Å. The films were sputtered in the apparatus after it had completed approximately 80 hours of reactively sputtering $Si_{3N4}$. (Specifically, after about 80 hours of reactively sputtering $Si_3N_4$ in the apparatus used in the first experiment, the wire wheels and nuts of the anodes were rearranged for use in the second experiment.) As is apparent, the overall film thickness uniformity shows further improvement compared to that of FIG. 8.

The cylindrical magnetron sputtering apparatus with anodes as configured in the first experiment was also employed to reactively sputter silicon dioxide. The films were sputtered in the apparatus after having completed 160 hours of operation. (Specifically, after completion of the second experiment, the wheel wires and nuts in the anodes of the apparatus were reconfigured back to the arrangement of the first experiment.) In this application oxygen replaced nitrogen as the reactive gas. The film thicknesses were similarly measured as the first experiment and FIG. 10 is a graph depicting the thickness deviation of two silicon dioxide films deposited. The thicknesses of the films ranged from 1100 to 1200 Å.

Magnetron sputtering devices employing the inventive anodes continued to operate and deposit films with good thickness uniformity, even after approximately 300 hours of reactive sputtering. This demonstrates that heavy accumulation of silicon nitride and/or silicon dioxide on the anodes did not occur.

It is to be understood that while the invention has been described above in conjunction with preferred specific embodiments, the description and examples are intended to illustrate and not limit the scope of the invention, which is defined by the scope of the appended claims.

It is claimed:

1. A magnetron apparatus for sputtering thin films onto a substrate comprising:

an evacuable coating chamber;

a cathode mounted in said coating chamber, wherein the cathode defines an outer target surface that comprises a sputtering material; and an anode defining an electrically conductive body and having a plurality of points emanating from said conductive body, each of said points being defined by a tip of a wire.

2. The magnetron apparatus as defined in claim 1, wherein the cathode comprises a rotatable elongated target, wherein the anode defines an elongated structure having a length that is approximately equal to that of the cathode, and wherein the anode is positioned adjacent to and parallel with the elongated target.

3. The magnetron apparatus as defined in claim 2, further comprising a second anode that defines a second electrically conductive body having a plurality of points emanating from said second electrically conductive body, each of said points being defined by a tip of a wire, wherein said second anode further defines a second elongated structure having a length that is approximately equal to that of the cathode, and wherein the second anode is positioned adjacent to and parallel with the elongated target such that the distance between said first anode and said cathode is approximately equal to the distance between said second anode and said cathode.

4. The magnetron apparatus as defined in claim 3, wherein said first and second anodes are equidistantly positioned on opposite sides of the cathode and evenly spaced along the length of the cathode.

5. The magnetron apparatus as defined in claim 1, wherein the cathode has a substantially planar target surface comprised of sputtering material, wherein the anode has a length that is approximately equal to that of the cathode, wherein the anode defines a plurality of said points positioned along substantially the entire length of the anode, and wherein the anode is positioned along one side of the target surface.

6. The magnetron apparatus as defined in claim 5, further comprising a second anode comprising a second electrically conductive body and having a plurality of points emanating from the second conductive body each of said points defined by a tip of a wire, wherein the second anode has a length that is approximately equal to that of the cathode, wherein the second anode defines a plurality of points positioned along substantially the entire length of the second anode, and wherein said first and second anodes are positioned on opposite sides of the cathode.

7. The magnetron apparatus as defined in claim 1, wherein the cathode has a substantially planar target surface that defines a perimeter, wherein the anode defines an elongated structure mounted adjacent to and along the perimeter of said planar surface, and wherein said anode defines a structure having a plurality of said points located along substantially its entire length.

8. The magnetron apparatus as defined in either claim 1, 2, 3, 4, 5, 6 or 7, wherein each anode comprises an electrically conductive central rod having a plurality of metallic wires attached thereto, and wherein each wire comprises means for attracting electrons and for reducing a rate of dielectric material accumulation on the anode during sputtering.

9. The apparatus as defined in claim 8, wherein said rod defines one or more gaps that do not have wires attached thereto.

10. A method of depositing a thin film onto a substrate comprising the steps of:

mounting a cathode into an evacuable coating chamber, wherein the cathode defines an outer target surface comprising a sputtering material;

mounting an anode in said evacuable chamber, wherein the anode defines an electrically conductive body having a plurality of points emanating therefrom, each of said points being defined by a tip of a wire; and sputtering the target thereby depositing a film onto the substrate.

11. The method of depositing a thin film as defined in claim 10, wherein the cathode comprises a rotatable elongated target, wherein the anode defines an elongated structure having a length that is approximately equal to that of the cathode, and wherein the anode is positioned adjacent to and parallel with the elongated target.

12. The method of depositing a thin film as defined in claim 11, further comprising the step of mounting a second anode into said evacuable coating chamber, wherein said second anode defines a second electrically conductive body having a plurality of points emanating from said second electrically conductive body, each of said points being defined be a tip of a wire, wherein said second anode further defines a second elongated structure having a length that is approximately equal to that of the cathode, and wherein the second anode is positioned adjacent to and parallel with the elongated target such that a distance between said first anode and said cathode is approximately equal to a distance between said second anode and said cathode.

13. The method of depositing a thin film as defined in claim 12, wherein the second anode has a length that is approximately equal to that of the cathode, wherein the second anode defines a plurality of said points positioned along substantially the entire length of the second anode, and wherein said first and second anodes are positioned on opposite sides of the cathode.

14. The method of depositing a thin film as defined in claim 10, wherein the cathode has a substantially planar target surface, wherein the anode has a length that is approximately equal to that of the cathode, with the anode defining a plurality of said points positioned along substantially the entire length of the anode, and wherein the anode is positioned along one side of the cathode.

15. The method of depositing a thin film as defined in either claim 10, 11, 12, 14, or 13, wherein each anode comprises an electrically conductive central rod having a plurality of metallic wires attached thereto, and wherein each wire comprises means for attracting electrons and for reducing a rate of dielectric material accumulation on the anode during sputtering.

16. The method of depositing a thin film as defined in claim 15 wherein said rod defines one or more gaps that do not have points attached thereto.

17. The method of depositing a thin film as defined in claim 15 further comprising the step of causing a reactive gas to flow into said evacuable coating chamber so that the film deposited comprises a metal-based compound.

* * * * *